(12) United States Patent
Takaya et al.

(10) Patent No.: US 7,586,151 B2
(45) Date of Patent: Sep. 8, 2009

(54) INSULATED GATE SEMICONDUCTOR DEVICE

(75) Inventors: Hidefumi Takaya, Nishikamo-gun (JP); Yasushi Okura, Toyokawa (JP); Akira Kuroyanagi, Okazaki (JP); Norihito Tokura, Okazaki (JP)

(73) Assignees: Toyota Jidosha Kabushiki Kaisha, Toyota-shi (JP); DENSO CORPORATION, Kariya-shi (JP)

( * ) Notice: Subject to any disclaimer, the term of this patent is extended or adjusted under 35 U.S.C. 154(b) by 371 days.

(21) Appl. No.: 11/578,949

(22) PCT Filed: May 11, 2005

(86) PCT No.: PCT/JP2005/009022

§ 371 (c)(1),
(2), (4) Date: Oct. 19, 2006

(87) PCT Pub. No.: WO2005/109514

PCT Pub. Date: Nov. 17, 2005

(65) Prior Publication Data

US 2007/0241394 A1    Oct. 18, 2007

(30) Foreign Application Priority Data

May 12, 2004    (JP) .............................. 2004-141825

(51) Int. Cl.
*H01L 29/78* (2006.01)
(52) U.S. Cl. .................. 257/330; 257/288; 257/329; 257/331; 257/332; 257/339; 257/341; 257/401; 257/E29.021; 257/E29.133
(58) Field of Classification Search ................. 257/330, 257/331, 332, E29.02, E29.021, E29.133, 257/E21.134, E29.135, E29.136, 288, 329, 257/339, 341, 401
See application file for complete search history.

(56) References Cited

U.S. PATENT DOCUMENTS 5,945,692 A * 8/1999 Yano et al. ................... 257/139

(Continued)

FOREIGN PATENT DOCUMENTS

| EP | 0 717 450 A2 | 6/1996 |
| EP | 1 406 310 A2 | 4/2004 |
| JP | 11-097689 | 4/1999 |
| JP | 2003-243671 | 8/2003 |

(Continued)

OTHER PUBLICATIONS

Naresh Tapar, et al.: *Influence of the Trench Corner Design on Edge Termination of UMOS Power* Devices, Solid State Electronics, vol. 41, No. 12, Dec. 1997, pp. 1929-1936, Elsevier Science Publishers, Barkinig, GB.

*Primary Examiner*—Kiesha L Rose
*Assistant Examiner*—Eric Ward
(74) *Attorney, Agent, or Firm*—Kenyon & Kenyon LLP

(57) ABSTRACT

The present invention provides an insulated gate semiconductor device which has floating regions around the bottoms of trenches and which is capable of reliably achieving a high withstand voltage. An insulated gate semiconductor device 100 includes a cell area through which current flows and an terminal area which surrounds the cell area. The semiconductor device 100 also has a plurality of gate trenches 21 in the cell area and a plurality of terminal trenches 62 in the terminal area. The gate trenches 21 are formed in a striped shape, and the terminal trenches 62 are formed concentrically. In the semiconductor device 100, the gate trenches 21 and the terminal trenches 62 are positioned in a manner that spacings between the ends of the gate trenches 21 and the side of the terminal trench 62 are uniform. That is, the length of the gate trenches 21 is adjusted according to the curvature of the corners of the terminal trench 62.

7 Claims, 14 Drawing Sheets

U.S. PATENT DOCUMENTS

| | | | |
|---|---|---|---|
| 6,462,376 B1 * | 10/2002 | Wahl et al. | 257/331 |
| 6,501,146 B1 * | 12/2002 | Harada | 257/475 |
| 6,667,515 B2 * | 12/2003 | Inoue | 257/341 |
| 6,936,893 B2 * | 8/2005 | Tanaka et al. | 257/341 |
| 7,169,634 B2 * | 1/2007 | Zhao et al. | 438/91 |
| 7,211,861 B2 * | 5/2007 | Teramae et al. | 257/330 |
| 7,339,237 B2 * | 3/2008 | Meyer | 257/349 |
| 7,365,391 B2 * | 4/2008 | Kurosaki et al. | 257/341 |
| 2001/0025984 A1 | 10/2001 | Osawa | |
| 2005/0156232 A1 * | 7/2005 | Hueting et al. | 257/330 |
| 2006/0289928 A1 * | 12/2006 | Takaya et al. | 257/330 |
| 2007/0155104 A1 * | 7/2007 | Marchant et al. | 438/270 |
| 2007/0262390 A1 * | 11/2007 | Ishida et al. | 257/368 |
| 2008/0087951 A1 * | 4/2008 | Takaya et al. | 257/334 |
| 2008/0135931 A1 * | 6/2008 | Challa et al. | 257/331 |

FOREIGN PATENT DOCUMENTS

| | | |
|---|---|---|
| JP | 2005-116822 | 4/2005 |
| WO | WO99/52152 | 10/1999 |
| WO | WO 2005/036650 A2 | 4/2005 |

* cited by examiner

L1≒L2≒L3

DISTANCE BETWEEN GATE TRENCH AND END TRENCH

L1 < L2 < L3

INSULATED GATE SEMICONDUCTOR DEVICE

This is a 371 national phase application of PCT/JP2005/009022 filed 11 May 2005, claiming priority to Japanese Application No. 2004-141825 filed 12 May 2004, the contents of which are incorporated herein by reference.

TECHNICAL FIELD

The present invention relates to an insulated gate semiconductor device having a trench gate structure. More specifically, the invention relates to an insulated gate semiconductor device which has floating regions around the bottoms of the trenches and which is capable of reliably achieving a high breakdown voltage through relief of an electric field which acts on the semiconductor layer.

BACKGROUND ART

As an insulated gate semiconductor device used for power devices, a trench gate semiconductor device having a trench gate structure has been proposed up until now. In the trench gate semiconductor device, a trade-off between high breakdown voltage and low on resistance is generally present.

The present applicants have proposed an insulated gate semiconductor device 900 shown in FIG. 11 as a trench gate semiconductor device which has solved such a problem (Japanese Patent Application No. 2003-349806). The insulated gate semiconductor device 900 is provided with N$^+$-type source regions 31, an N$^+$-type drain region 11, a P$^-$-type body region 41, and an N$^-$-type drift region 12. Also, gate trenches 21, which pass through the N$^+$-type source region 31 and the P$^-$-type body region 41, are formed by grooving parts of the top surface of the semiconductor substrate. In the lower part of the gate trench 21, a deposited insulating layer 23 comprised of an insulating material deposit is formed. On the deposited insulating layer 23, a gate electrode 22 is formed. The gate electrode 22 faces the N$^+$-type source region 31 and the P$^-$-type body region 41 via a gate insulating film 24 formed on the side of the gate trench 21. Further, P-type floating regions 51 are formed within the N$^-$-type drift region 12. The lower end of the gate trench 21 is located within the P-type floating region 51.

Having the P-type floating regions 51 in the N$^-$-type drift region 12, the insulated gate semiconductor device 900 has the following characteristics in comparison with insulated gate semiconductor devices having no floating region: a depletion layer is formed from the PN junction between the N$^-$-type drift region 12 and the P$^-$-type body region 41 by a voltage between the drain and the source (hereinafter referred to as "D and S") during the switch-off of a gate voltage; electric field strength peaks near the PN junction; when the extremity of the depletion layer reaches the P-type floating regions 51, the regions 51 are placed into a punch-through state, so that its potential is fixed; when the applied voltage between D and S is high, depletion layers are also formed from the lower end of the P-type floating regions 51; the electric field strength also peaks near the lower end of the P-type floating regions 51 aside from the PN junction between the P$^-$-type body region 41 and the N$^-$-type drift region 12, that is, the peak of the electric field can be formed at two places, so that its maximum peak value is reduced, which allows a high breakdown voltage to be achieved; and the semiconductor device 900 with the high breakdown voltage is able to have a low on resistance through an increase in the impurity concentration of the N$^-$-type drift region 12.

Additionally, as shown in FIG. 12, the gate trenches 21 of the insulated gate semiconductor device 900 are arranged in a striped shape in a cell area (within a broken-line box in FIG. 12). Further, in an terminal area (outside of the broken-line box X in FIG. 12), terminal trenches 62 are formed so as to encompass the cell area. Still further, P-type floating regions are also formed around the bottom of the terminal trenches. In this way, the breakdown voltage of the entire insulated gate semiconductor device 900 is increased. Examples of the semiconductor device in which the trenches are formed so as to encompass the cell area include, for example, a diode element disclosed in Patent Document 1.

[Patent Document 1] Japanese Published Unexamined Patent Application No. 2003-243671

However, the insulated gate semiconductor device 900 has the following problems: electrostatic focusing is relieved thickness-wise since the depletion layer formed from the PN junction between the N$^-$-type drift region 12 and the P$^-$-type body region 41 is connected with the depletion layers formed from the P-type floating regions 51; and electrostatic focusing is relieved sidewise since the depletion layers formed from the P-type floating regions 51 are connected with the depletion layer formed from the other P-type floating region.

The linkage of the depletion layer formed from the PN junction between the N$^-$-type drift region 12 and the P$^-$-type body region 41 and the depletion layers formed from the P-type floating regions 51 depends upon the thickness-wise structural design of the semiconductor substrate. Because of this, high breakdown voltage is reliably achieved by designing the structure in consideration of the thickness-wise spread of the depletion layers in advance. On the other hand, the linkages of the depletion layers formed from the P-type floating regions depend upon the sidewise structural design of the semiconductor substrate. Because of this, the high breakdown voltage is achieved by designing the structure in consideration of the sidewise spread of the depletion layers in advance. However, when there are variations in the distances between the P-type floating regions, the linkage of the depletion layers may not occur. As a result, the breakdown voltage may decrease at portions where the linkage of the depletion layers has not occurred.

For instance, the regions where the breakdown voltage of the insulated gate semiconductor device 900 decreases are as follows; the terminal trenches 62 within the terminal area are formed so as not to connect with the gate trenches 21 within the cell area as shown in FIG. 12, so that the gate trenches 21 have gaps; as shown in FIG. 13, portions where spacings between the side of the terminal trench 62 and the ends of the gate trenches 21 are long (L1<L2 in FIG. 13) are present near the gaps (within a solid-line box Y in FIG. 12); and this brings variations in spacings between the P-type floating regions around the bottom of the terminal trenches 62 and the P-type floating regions around the bottom of the gate trenches 21.

Also, near the corners of the terminal trench 62 (within the solid-line box Z in FIG. 12) among the gaps of the gate trenches 21, variations in the spacings between the ends of gate trenches 21 and the side of the terminal trench 62 clearly occur as shown in FIG. 14. This is because the respective gate trenches 21 formed in a striped shape are formed so as to have a uniform length and their ends are evened up in the direction of their length (see FIG. 12). Specifically, near the corners of the terminal trench 62, the closer the gate trenches 21 are formed toward the corners of the terminal trench 62, the narrower the spacings between the ends of the gate trenches 21 and the terminal trench 62 become (L1<L2<L3 in FIG. 14). Likewise, the closer the gate trenches 21 are formed toward the corners of the terminal trench 62, the narrower spacings between the P-type floating region 53 around the bottom of the terminal trench 62 and the P-type floating regions 51 around the bottom of the gate trenches 21 become.

Further, in order to solve these problems, it is also considered that the gate trenches 21 are linked with the terminal trench 62 as shown in FIG. 15. The gaps of the trenches can be eliminated by arranging each trench in such a way. However, when the trench junctions are formed by dry etching, the volume of etching gas entering the junctions is different from that entering the portions other than the junctions. Because of this, etching proceeds readily at the junctions, which makes the depths of the trenches uneven. FIG. 16 is a sectional view taken along the line C-C of the semiconductor device shown in FIG. 15. As shown in FIG. 16, the depth of the trench junctions is greater than that of the portions other than the junctions. As a result, the depth of the P-type floating region around the bottom of the linked trenches also becomes greater, which brings about a decrease in the breakdown voltage.

Still further, when the trenches are linked with each other, they also widen at their junctions. Because of this, the size of the P-type floating regions becomes larger than that based on their design value. As a result, the size of the $N^-$-type drift region 12 is reduced, which makes on resistance high.

Furthermore, an insulating material is embedded in the gate trenches 21 of the insulated gate semiconductor device 900, after which the insulating material is etch-backed to form spaces. A conductor is embedded in the spaces formed by etch back to form the gate electrodes 22. At this time, when the trenches are wide, the insulating material cannot be embedded sufficiently, so that voids and so on may occur within the deposited insulating layers. When deposited insulating layers having voids are etch-backed, etching proceeds at the void portions rapidly to form wedge-shaped grooves in the deposited insulating layers. Then, a gate material gets into the wedge-shaped grooves, so that depletion layers spread into directions which are different from those based on their design. Because of this, unlike common trench gate semiconductor devices, it is preferable that the insulated gate semiconductor device 900 has no trench junction.

The present invention has been realized by solving the problems which the conventional insulating gate semiconductor device has. That is, an object of the invention is to provide an insulated gate semiconductor device which has floating regions around the bottom of trenches and which is capable of reliably exhibiting a high breakdown voltage.

DISCLOSURE OF THE INVENTION

An insulated gate semiconductor device fabricated to solve the problems includes a body region, which is a semiconductor of a first conductivity type and which is on the upper side of a semiconductor substrate, and a drift region which is a semiconductor of a second conductivity type and which is in contact with the bottom of the body region. The insulated gate semiconductor device also includes a first trench group, which are formed in a striped shape when viewed from above, pass through the body region, and contain gate electrodes, and a second trench having portions formed in an arc shape when viewed from above. Further, the insulated gate semiconductor device includes first floating regions, which are surround by the drift region, surround the bottom of at least one of the trenches of the first trench group, and are a semiconductor of the first conductivity type, and a second floating region which is surrounded by the drift region, surrounds the bottom of the second trench, and is a semiconductor of the first conductivity type. When viewed from above, the ends of each trench of the first trench group are opposite the side of the second trench, and spacings between the ends of each trench of the first trench group and the side of the second trench are uniform.

That is, the insulated gate semiconductor device of the invention is provided with the first trench group formed in a striped shape and the second trench of which at least one portion is formed in an arc shape. The floating region is provided around the bottom of each trench, and electrostatic focusing can be relieved by the floating regions.

The ends of each trench of the first trench group are opposite the side of the second trench. That is, each trench of the first trench group is not linked with the second trench. Because of this, a decrease in the breakdown voltage caused by trench junctions does not occur. Additionally, each trench of the first trench group is positioned in such a manner that the spacings between the ends thereof and the side of the second trench are uniform. Thus, there are no variations in the spacings between the first floating regions and the second floating regions, so that a decrease in the breakdown voltage caused by the gaps does not occur.

In particular, even at places where the ends of all or part of the trenches which make up the first trench group are opposite the side of the arc-shaped portions of the second trench, the trenches of the first trench group are positioned in such a manner that the spacings between the ends thereof and the side of the second trench become uniform. That is, the ends of each trench of the first trench group are positioned along the arc-shaped curved surfaces. Therefore, even at such places, there are no variations in the spacings between the ends of each trench of the first trench group and the side of the second trench, so that a decrease in the breakdown voltage caused by the gaps does not occur. To hold the spacings between the ends of each trench of the first trench group and the side of the second trench uniform like this, for example, the length in the direction of the length of the respective trenches of the first trench group is determined in accordance with the curvature of the second trench.

When there are portions where the spacings between the ends of the trenches of the first trench group and the side of the second trench are longer than the shortest spacings between them, a floating region can be formed at the portions. This makes it possible to reliably suppress the decrease in the breakdown voltage. Further, the two adjacent trenches of the first trench group may be linked with each other at the ends thereof (see FIG. 10).

It is preferable that the second trench of the insulated gate semiconductor device has a circular structure when viewed from above, and the first trench group may be formed within the circular region defined by the second trench. That is, when the second trench is formed in a circular shape, and the first trench group are formed in a striped shape within the circular region, variations in spacings between the ends of each trench of the first trench group and the side of the second trench tend to occur. Therefore, like the first trench group of the invention, it is particularly effective in that a decrease in the breakdown voltage is suppressed to make spacings between the ends of the trenches thereof and the side of the second trench uniform.

Additionally, another insulated gate semiconductor device of the invention has a body region, which is on the upper side of a semiconductor substrate and is a semiconductor of the first conductivity type, and a drift region which is in contact with the bottom of the body region and is a semiconductor of the second conductivity type. Further, the insulated gate semiconductor device includes a first trench group, which are formed in a striped shape when viewed from above, pass through the body region, and contain gate electrodes, and a second trench which is located between the adjacent trenches of the first trench group and is not in contact with each trench of the first trench group. Still further, the insulated gate semiconductor device includes first floating regions, which are surrounded by the drift region, surround the bottom of at least one of the trenches of the first trench group, and are a semiconductor of the first conductivity type, and a second floating region which is surrounded by the drift region, surrounds the bottom of the second trench, and is a semiconductor of the first conductivity type.

That is, the insulated gate semiconductor device of the invention is provided with the first trench group formed in a striped shape and the second trench formed between the adjacent trenches of the first trench group. Around the bottom of each trench, the floating region is provided. The floating regions make it possible to relieve electrostatic focusing, which allows high breakdown voltage. Further, by embedding a gate electrode in the second trench, channel regions can be increased in the cell area, which allows a reduction in channel resistance.

Additionally, each trench of the first trench group is not in contact with the second trench; that is, each trench of the first trench group is not linked with the second trench. Therefore, a decrease in the breakdown voltage caused by trench junctions does not occur, by which channel resistance is reduced without a decrease in the breakdown voltage.

Furthermore, it is preferable that the insulated gate semiconductor device has a third trench, which has portions formed in an arc shape when viewed from above, and a third floating region which is surrounded by the drift region, surrounds the bottom of the third trench, and is a semiconductor of the first conductivity type. It is also preferable that the ends of each trench of the first trench group be opposite the side of the third trench when viewed from above, and spacings between the ends of each trench of the first trench group and the side of the third trench be uniform. In addition, it is preferable that the third trench has a circular structure when viewed from above, and the first trench group and the second trench be positioned in the circular region defined by the third trench.

BEST MODE FOR CARRYING OUT THE INVENTION

In the following, embodiments of the present invention will be explained in detail with reference to the drawings. In these embodiments, the invention is applied to a power MOS which controls electrical continuity between drains and sources (D and S) through the application of voltage to gates.

First Embodiment

An insulated gate semiconductor device 100 (hereinafter, "semiconductor device 100") according to a first embodiment has a structure shown in the perspective plan view of FIG. 1 and the sectional view of FIG. 2. In this specification, the term semiconductor substrate refers to a portion consisting of a starting substrate and a single-crystal silicon portion formed on the starting substrate by epitaxial growth.

Figure 1:
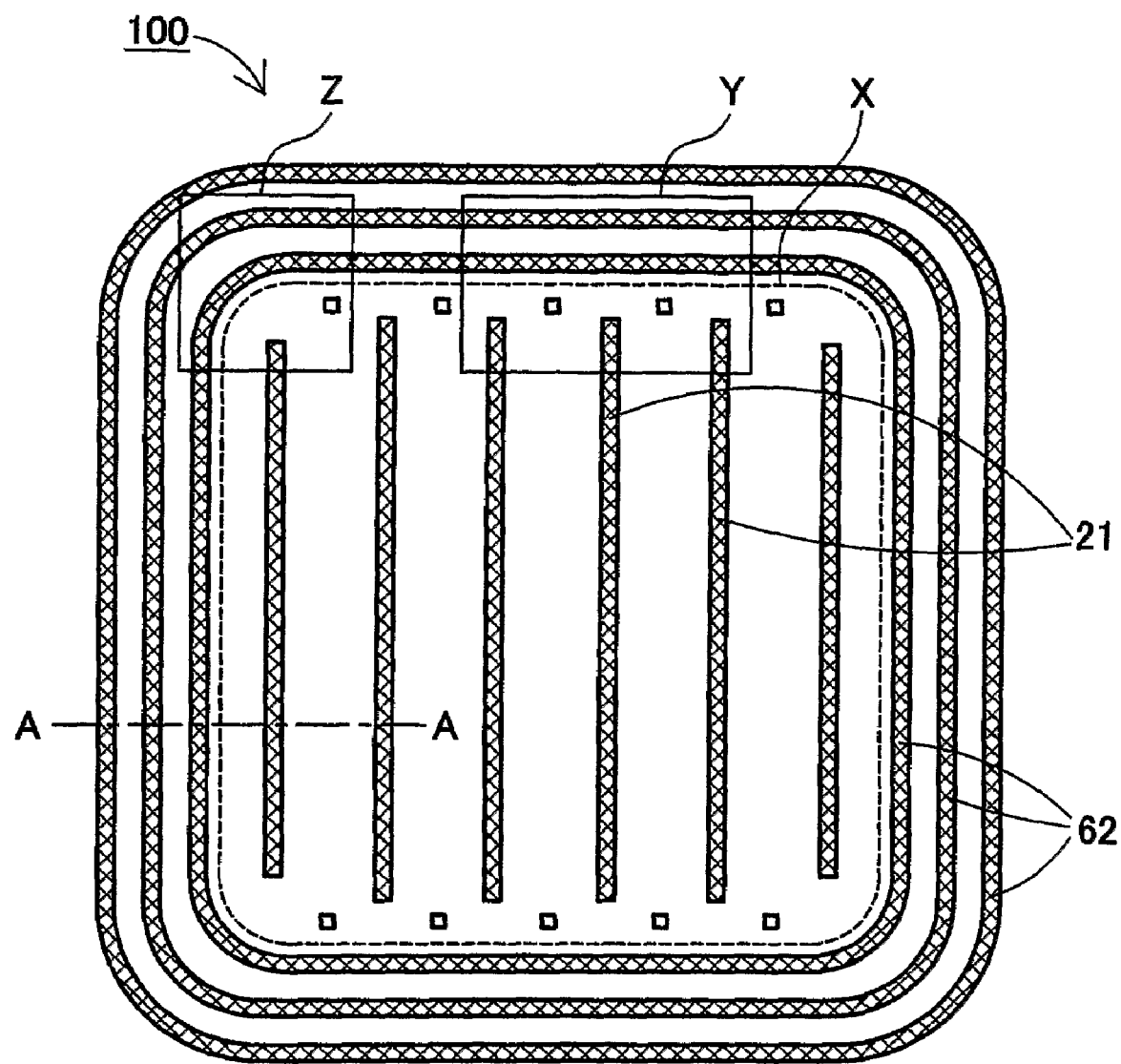
FIG. 1 is a plan view showing the structure of an insulated gate semiconductor device according to a first embodiment of the present invention.

As shown in FIG. 1, the semiconductor device 100 according to the embodiment in a cell area (within a broken-line box X in FIG. 1) through which current flows and an terminal area (outside of the broken-line box X in FIG. 1) surrounding the cell area. That is, the cell area in the semiconductor device 100 is defined by the terminal area. Also, the semiconductor device 100 has a plurality of gate trenches 21 in the cell area and a plurality of terminal trenches 62 in the terminal area. Further, the gate trenches 21 are positioned in a striped shape, the terminal trenches 62 are positioned concentrically. Still further, the gate trenches 21 are formed so as not to be linked with the terminal trenches 62. As a result, the semiconductor device 100 has no trench junction. Therefore, all the trenches of the semiconductor device 100 are uniform in depth and width.

Figure 2:
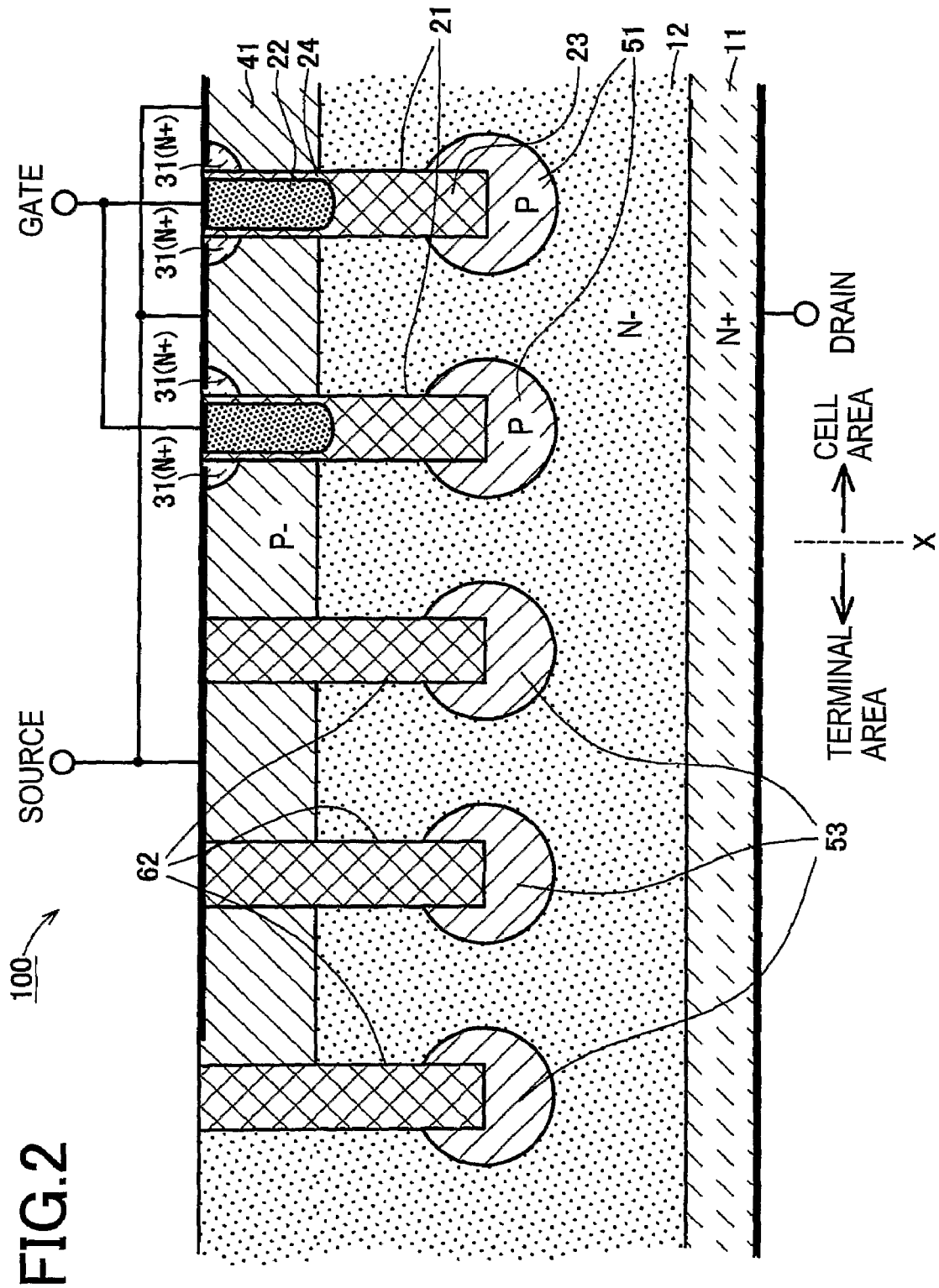
FIG. 2 is a sectional view taken along the line A-A of the insulated gate semiconductor device shown in FIG. 1.

FIG. 2 is a sectional view taken along the line A-A of the semiconductor device 100 shown in FIG. 1. In the semiconductor device 100 according to the embodiment, a source electrode 30 is provided on the top surface of the semiconductor substrate, and a drain electrode 10 is provided on the under surface of the semiconductor substrate as shown in FIG. 2. Also, N$^+$-type source regions 31 and a N$^+$-type drain region 11 are provided in the semiconductor substrate. Additionally, between the N$^+$-type source regions 31 and the N$^+$-type drain region 11, a P$^-$-type body region 41 and a N$^-$-type drift region 12 are provided from above downward. The total thickness of the P$^-$-type body region 41 and the N$^-$-type drift region 12 is about 5.5 μm (of which the thickness of the P$^-$-type body region 41 is about 1.2 μm).

Also, the gate trenches 21 and the terminal trenches 62 are formed by the grooving part of the top surface of the semiconductor substrate. The depth of each trench is about 2.3 μm, and each trench passes through the P$^-$-type body region 41. Additionally, deposited insulating layers 23 comprised of an insulating material deposit are formed at the bottoms of the gate trenches 21. Specifically, the deposited insulating layer 23 according to the embodiment is formed by depositing silicon oxide to a height of about 1.1 μm above the bottom of the gate trench 21. Further, a gate electrode 22 is formed on the deposited insulating layer 23. The position of the lower end of the gate electrode 22 is lower than that of the bottom of the P$^-$-type body region 41. The gate electrode 22 faces the N$^+$-type source region 31 and the P$^-$-type body region 41 in the semiconductor substrate via a gate insulating film 24 formed on the side of the gate trench 21. That is, the gate electrode 22 is insulated from the N$^+$-type source region 31 and the P$^-$-type body region 41 by the gate insulating film 24. Also, the terminal trenches 62 are filled with an insulating material such as silicon oxide.

In the semiconductor device 100 having such a structure, a channel effect is produced in the P$^-$-type body region 41 by the application of voltage to the gate electrodes 22, by which electrical continuity between the N$^+$-type source region 31 and the N$^+$-type drain region 11 is controlled.

Further, in the semiconductor device 100, P-type floating regions 51 and 53 are formed so as to be surrounded by the N$^-$-type drift region 12. The P-type floating regions 51 are formed by injecting an impurity from the bottom of the gate trenches 21, and the P-type floating regions 53 are formed by injecting the impurity from the bottom of the terminal trenches 62. The cross section of each P-type floating region is substantially a circle with a radius of 0.6 μm whose center is the bottom of each trench. Between the adjacent P-type floating regions 51, there are sufficient spaces to which carriers are able to move. Thus, the P-type floating regions 51 do not interfere with drain current at the switch-on state of gate voltage.

Also, the radius of each P-type floating region 51 (about 0.6 μm) is half the thickness or less of the deposited insulating layer 23 (about 1.7 μm). Thus the position of the upper end of the deposited insulating layer 23 is higher than that of the upper end of the P-type floating region 51. Therefore, the gate electrode 22 deposited on the deposited insulating later 23 does not face the P-type floating layer 51, by which the element characteristics of the semiconductor device 100 is not affected.

Figure 3:
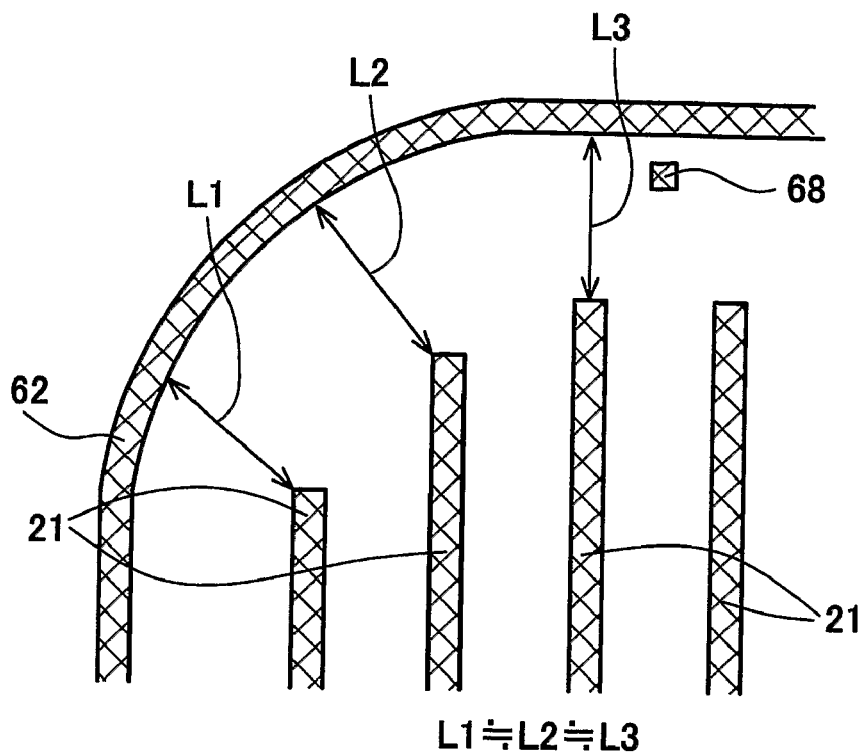
FIG. 3 is a plan view showing a corner and its vicinity of an terminal trench of the insulated gate semiconductor device shown in FIG. 2.

Further, in the semiconductor device 100, the lengths of the gate trenches 21 are adjusted according to distances between the ends of the gate trenches 21 and the side of the terminal trench 62. FIG. 3 is a fragmentary plan view showing a corner and its vicinity of the terminal trench 62 of the semiconductor device 100 (within the solid-line box Z in FIG. 1). In the semiconductor device 100, each gate trench 21 is positioned in a manner that the shortest distances between the ends of the gate trenches 21 and the side of the terminal trench 62 are uniform. That is, variations in the distances between the ends of the gate trenches 21 and the terminal trench 62 are eliminated by adjusting the lengths of the gate trenches 21, i.e., the positions of the ends of the gate trenches 21, in accordance with the curvature of the corner portion of the terminal trench 62. As a result, variations in spacings between the P-type floating regions 51 and the P-type floating region 53 are also eliminated, which suppresses a decrease in the breakdown voltage.

Figure 4:
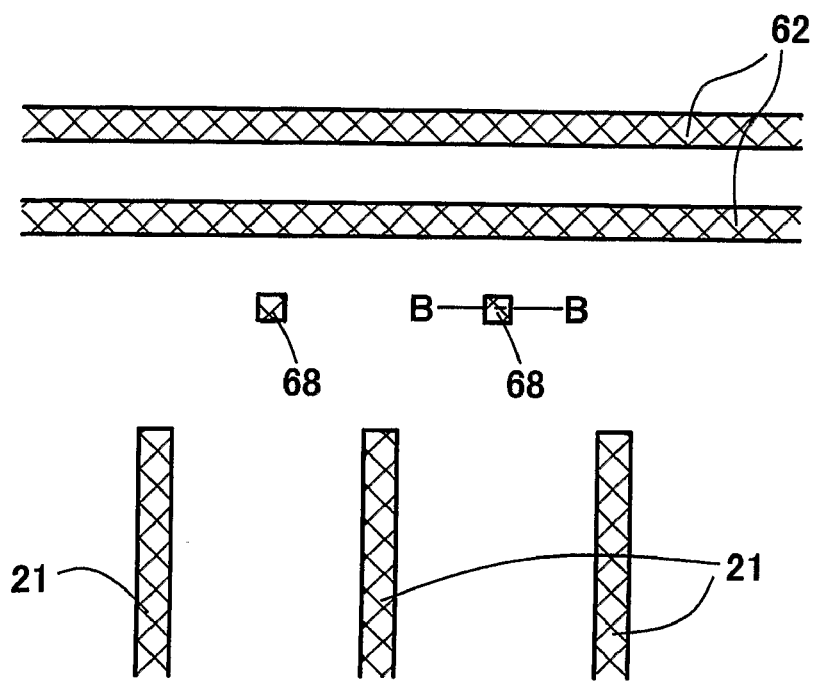
FIG. 4 is a plan view showing (as a first example) gap portions of gate trenches of the insulated gate semiconductor device shown in FIG. 2.
Figure 5:
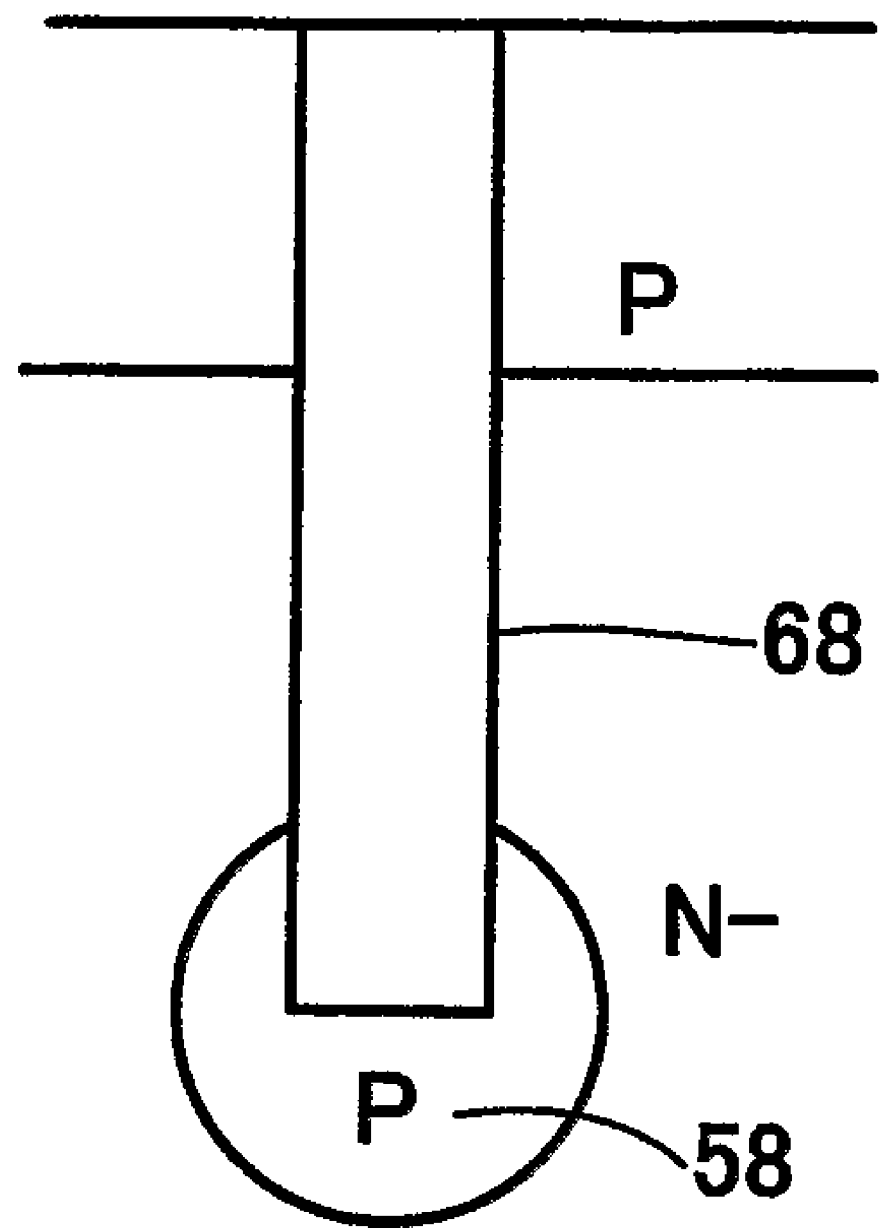
FIG. 5 is a sectional view taken along the line B-B of the insulated gate semiconductor device shown in FIG. 4.

FIG. 4 is a fragmentary plan view showing the gap portions of the gate trenches 21 of the semiconductor device 100 (within a solid-line box Y in FIG. 1). In the semiconductor device 100, a dot-shaped the breakdown voltage holding trench 68 is provided at portions where the spacings between the ends of the gate trenches 21 and the side of the terminal trench 62 is wider than that between the gate trenches 21 and 21 in the cell area. FIG. 5 is a sectional view taken along the line B-B of the semiconductor device 100 shown in FIG. 4. As shown in FIG. 5, the breakdown voltage holding trenches 68 are filled with an insulating material such as silicon oxide. Additionally, a P-type floating region 58 surrounded by the N$^-$-type drift region 12 is provided around the lower end of the breakdown voltage holding trench 68. That is, when the spacing between the P-type floating region 51 and the P-type floating region 53 is wide, the P-type floating region 58 is provided between them, by which variations in the distances between the P-type floating regions are eliminated.

Figure 6:
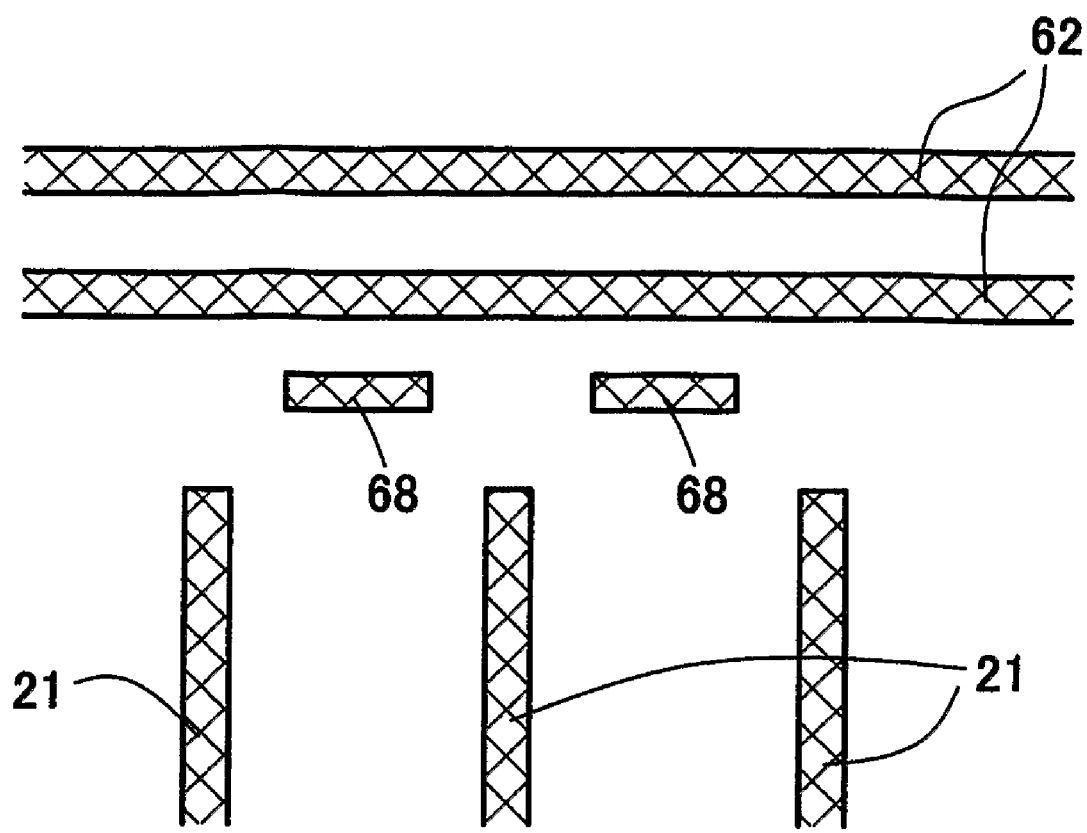
FIG. 6 is a plan view showing (as a second example) gap portions of gate trenches of the insulated gate semiconductor device shown in FIG. 2.

The shape of the breakdown voltage holding trench 68 viewed from above the semiconductor device 100 need not be limited to the shape of a dot shown in FIG. 4. That is, the shape may be a rectangle as shown in FIG. 6. Further, it is not limited to the rectangle, but may be a circle and so on.

Figure 7:
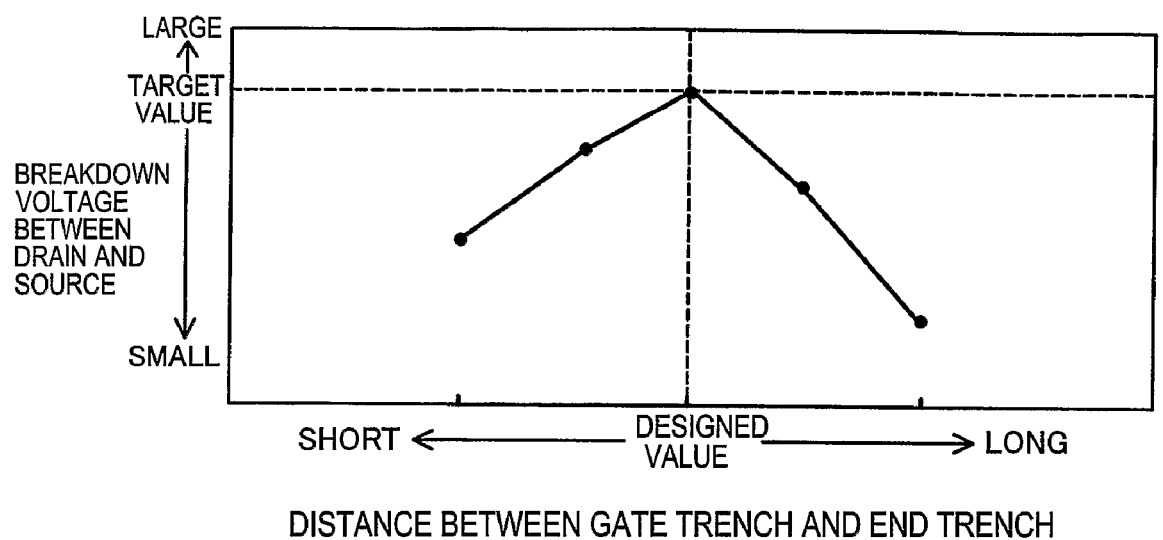
FIG. 7 is a graph showing a relationship between spacings Lx and the breakdown voltages between D and S (at a constant gate voltage)

Next, a result obtained by a simulation of the breakdown voltage between D and S of the semiconductor device 100 will be explained. FIG. 7 is a graph showing a result obtained by performing the simulation of the breakdown voltage between D and S while adjusting the shortest distance Lx between the ends of the gate trenches 21 and the side of the terminal trench 62. As shown in FIG. 7, it is found that the breakdown voltage decreases when the distance Lx is longer than that based on its design. It is considered that this is because it becomes difficult for depletion layers formed from the P-type floating regions 51 to connect with a depletion layer formed from the P-type floating region 53 as the distance Lx becomes long. It is also found that the breakdown voltage decreases when the spacing Lx is shorter than that based on its design. As a result, it is found that whether the distance Lx becomes longer or shorter than that based on its design, the breakdown voltage decreases; that is, it is important that the distance Lx conforms to its design value. Specifically, when the tolerance of the breakdown voltage is 10%, the tolerance of the distance Lx is ±15%.

As explained above in detail, the semiconductor device 100 according to the first embodiment has a structure in which the ends of the gate trenches 21 provided in a striped shape are opposite the side of the terminal trench 62 provided in a circular shape. Further, the gate trenches 21 are positioned in a manner that the shortest distances between the ends of the gate trenches 21 and the side of the terminal trench 62 are uniform. Specifically, as for the spacings, a distance is secured which is at the level that the P-type floating regions do not come in contact with each other. To be precise, depending on the impurity concentration of the epitaxial layer, etc., the breakdown voltage is increased by bringing the P-type floating regions as close as possible to each other while securing a distance which is at the level that they do not come in contact with each other. By not making them come in contact with each other, areas to which depletion layers spread are secured. Consequently, it is possible to reliably connect the depletion layers formed from the P-type floating regions 51 around the bottoms of the gate trenches 21 with the depletion layer formed from the P-type floating region 53 around the bottom of the terminal trench 62. It is thus possible to suppress a decrease in the breakdown voltage at the gaps and their vicinity of the gate trenches 21 (including the corners and their vicinity of the terminal trench 62). Therefore, an insulated gate semiconductor device is implemented which has the floating regions around the bottom of the trenches and which is capable of reliably achieving a high breakdown voltage.

For instance, at the corners and their vicinity of the terminal trench 62, the ends of the gate trenches 21 are provided along the arc portions of the terminal trench 62 in a manner that the spacings (the shortest distances) between the ends of the gate trenches 21 and the side of the terminal trench 62 become uniform. This makes the spacings between the P-type floating regions 51 and the P-type floating region 53 uniform, which suppresses a decrease in the breakdown voltage at the corners and their vicinity of the terminal trench 62.

Near the gaps of the gate trenches 21, a the breakdown voltage holding trench 68 is provided at the portions where the spacings between the ends of the gate trenches 21 and the side of the terminal trench 62 are wide. The P-type floating region 58 is also provided around the bottom of the breakdown voltage holding trench 68. This makes it possible to connect depletion layers formed from the P-type floating regions 51 with depletion layers formed from the P-type floating regions 58. As a result, decreases in the breakdown voltage are suppressed near the gaps of the gate trenches 21.

Second Embodiment

Figure 8:
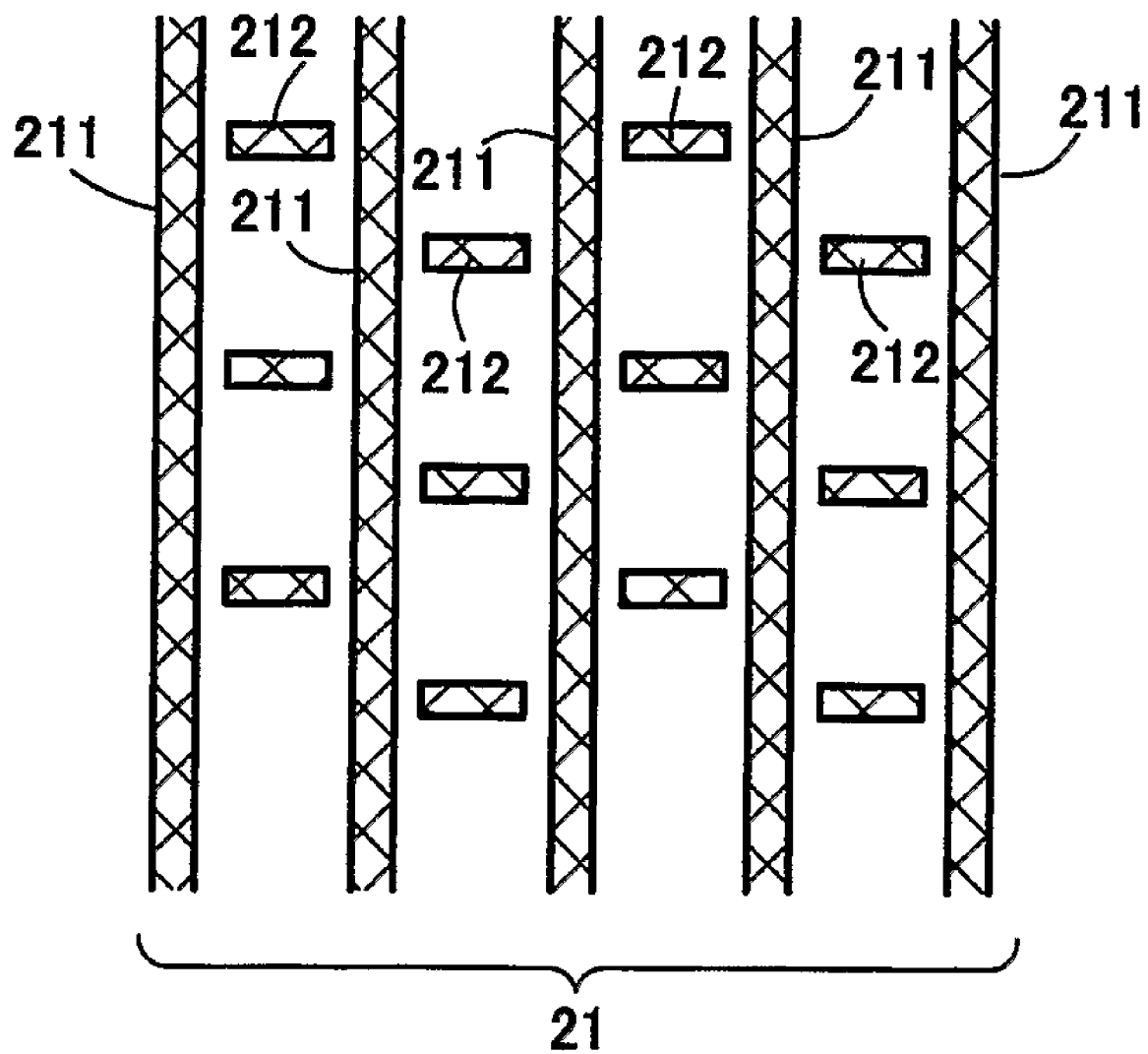
FIG. 8 is a plan view showing a structure of an insulated gate semiconductor according to a second embodiment.

As shown in FIG. 8, a semiconductor device 200 according to a second embodiment is provided with gate trenches 21 positioned in a ladder shape. The gate trenches 21 are composed of gate trenches 211 positioned parallel with one another in the longitudinal direction in FIG. 8 and gate trenches 212 positioned so as not to intersect with the gate trenches 211 in the lateral direction in FIG. 8. That is, the gate trenches 21 are arranged in a ladder shape without having any junctions. As a matter of course, a gate electrode is embedded in both gate trenches 211 and gate trenches 212.

In the semiconductor device 200 according to the embodiment, channel regions can be increased by arranging the gate trenches 21 in a ladder shape, by which channel resistance is reduced. Further, in the semiconductor device 200, the lateral gate trenches 212 are not linked with the longitudinal gate trenches 211; that is, the gate trenches 21 are not provided with any junctions. Because of this, the gate trenches 21 are uniform in depth and width. Thus, in regard to the P-type floating regions around the bottom of the gate trenches, variations in position and size do not occur.

That is, in the semiconductor device 200 according to the second embodiment, channel resistance is reduced by arranging the gate trenches 21 in a ladder shape. Further, the gate trenches 21 are arranged in a manner that the longitudinal gate trenches 211 are not linked with the lateral gate trenches 212. Because of this, variations in the position of the P-type floating regions 51 around the bottom of the gate trenches 21 do not occur in the direction of their thickness. In addition, since the widths of the gate trenches 21 are also uniform, the size of the P-type floating regions 51 is also the same as that designed. As a result, an insulated gate semiconductor device capable of reducing channel resistance and of reliably suppressing a decrease in the breakdown voltage has been realized.

The embodiments of the invention specifically illustrated herein are exemplary only, and therefore they are not to be construed as limiting the scope of the invention. Thus, it is apparent that various modifications and changes can be made without departing from the spirit and scope of the invention. For instance, as to the respective semiconductor regions, the P and N conductivity types may be interchanged. As for the gate insulating film 24, other insulating films, such as nitride film, and composite film may be used instead of the oxide film. As for the semiconductor, other semiconductors (such as SiC, GaN, and GaAs) may be used instead of silicon. The insulated gate semiconductor devices according to the embodiments of the invention are also applicable to conductivity modulation power MOSFETs using a P-type substrate.

Figure 9:
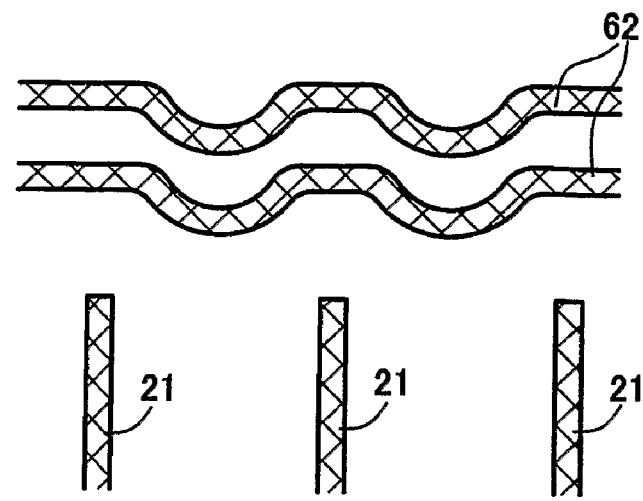
FIG. 9 is a plan view showing a structure of an insulated gate semiconductor device according to a (first) modification.

Also, according to these embodiments of the invention, the breakdown voltage holding trench 68 is provided to suppress the decrease in the breakdown voltage caused by the gaps of the gate trenches 21; however, it is not limited thereto. That is, as shown in FIG. 9, the terminal trenches 62 may be formed in a curved shape so as to keep the spacings between the ends of the gate trenches 21 and the side of the terminal trench 62 constant; the spacings between the gate trenches 21 and the terminal trench 62 becomes uniform by giving the curved shape to the terminal trench 62. As a result, the spacings between the P-type floating regions 51 and the P-type floating region 53 also becomes uniform, which allows the decrease in the breakdown voltage to be suppressed.

Figure 10:
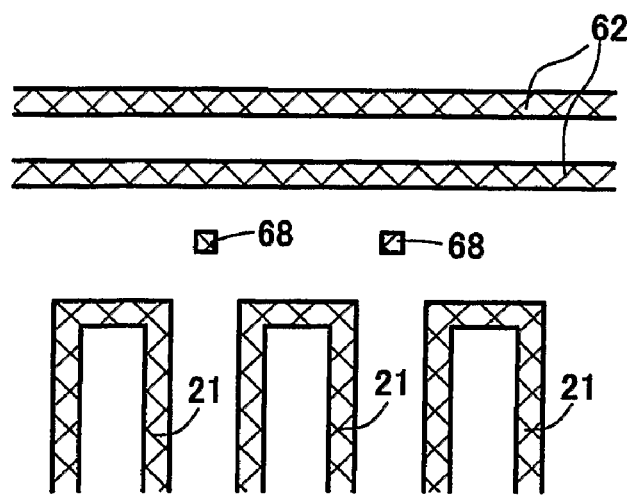
FIG. 10 is a plan view showing a structure of an insulated gate semiconductor according to a (second) modification.
Figure 11:
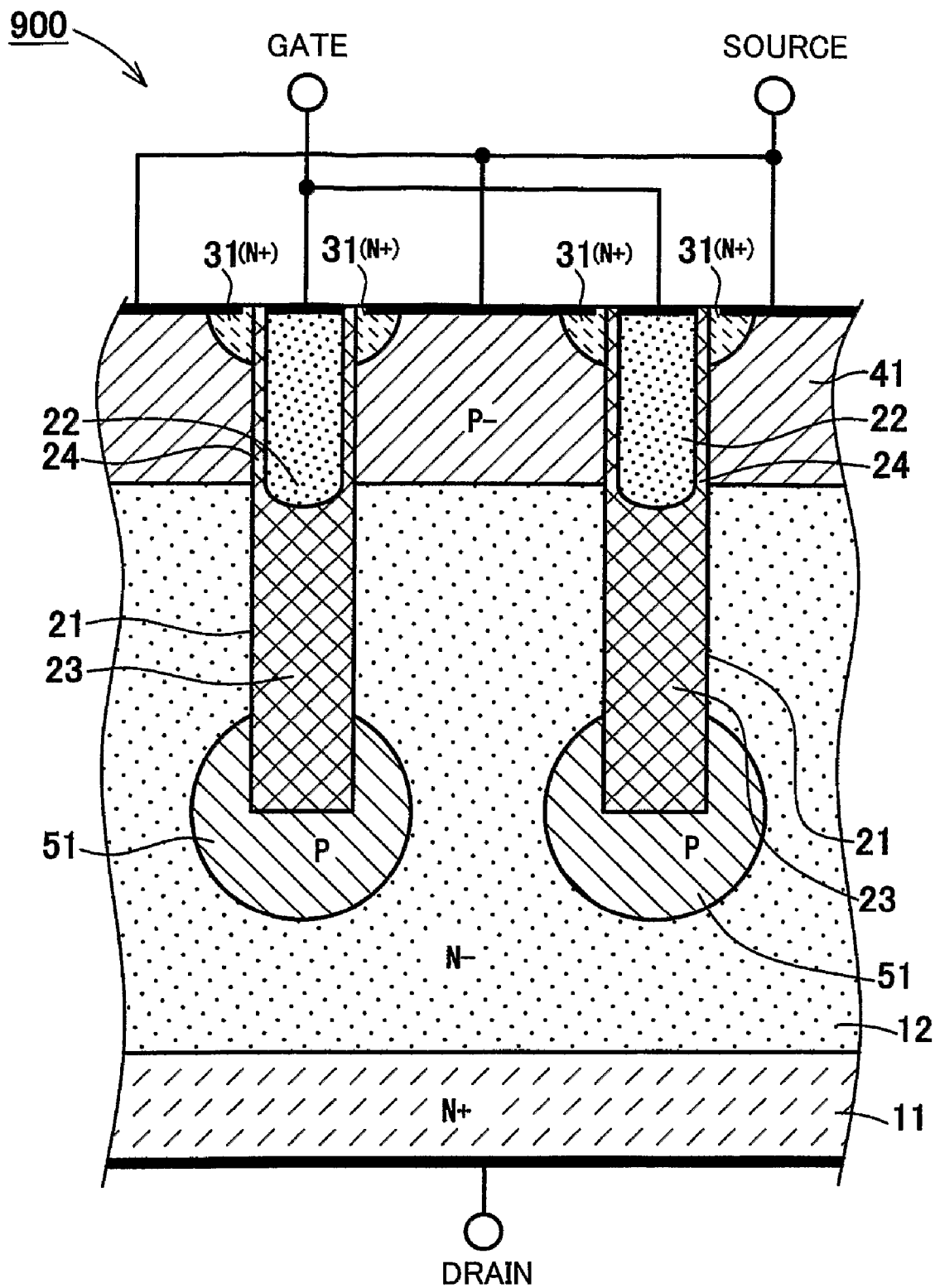
FIG. 11 is a sectional view showing a structure of a conventional insulated gate semiconductor device.
Figure 12:
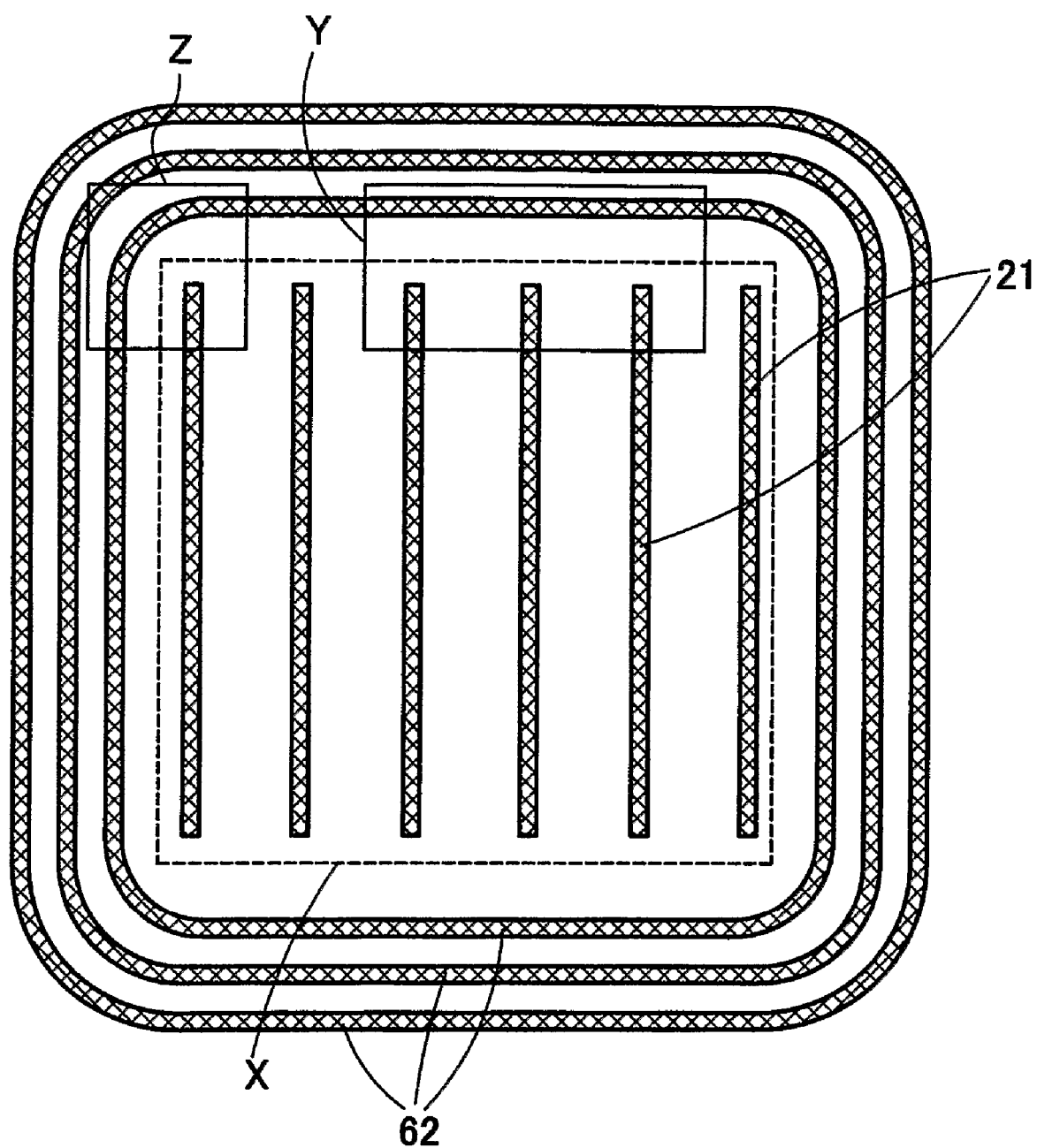
FIG. 12 is a plan view showing a structure of a conventional insulated gate semiconductor device (having gaps)
Figure 13:
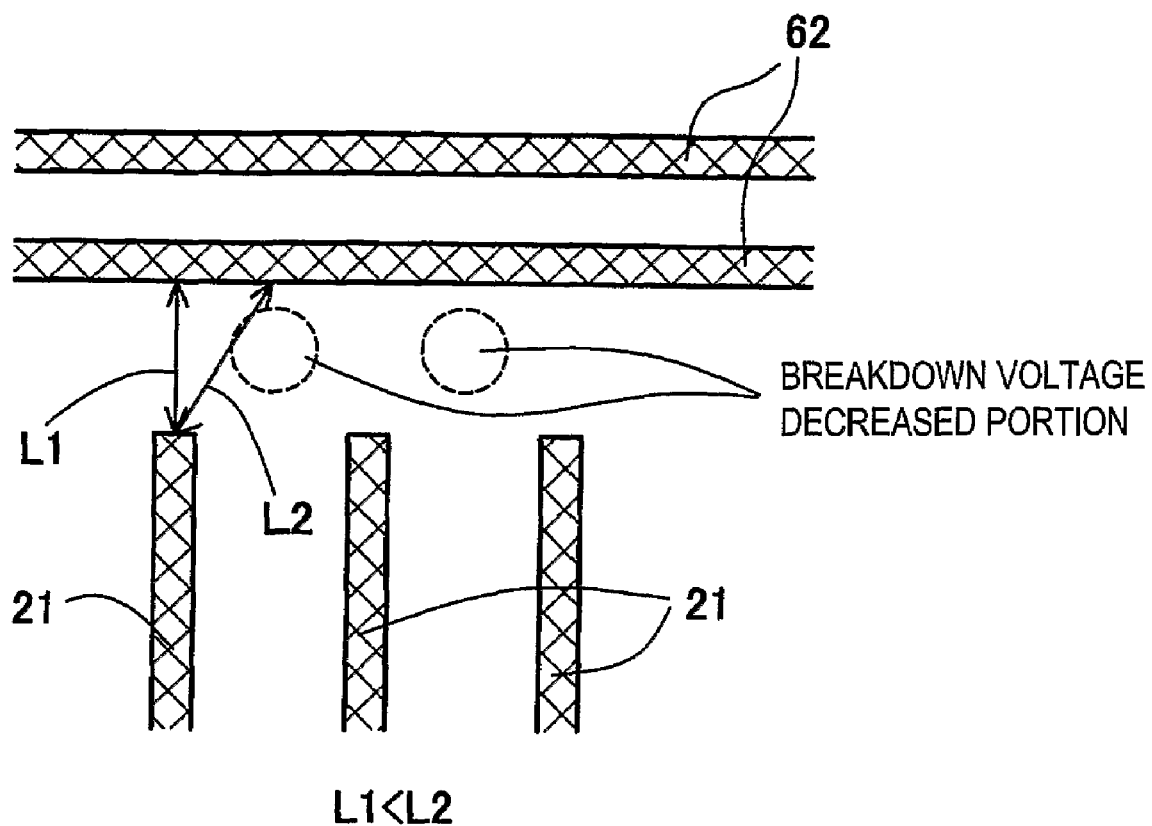
FIG. 13 is a plan view showing gap portions of gate trenches of the insulated gate semiconductor device shown in FIG. 12.
Figure 14:
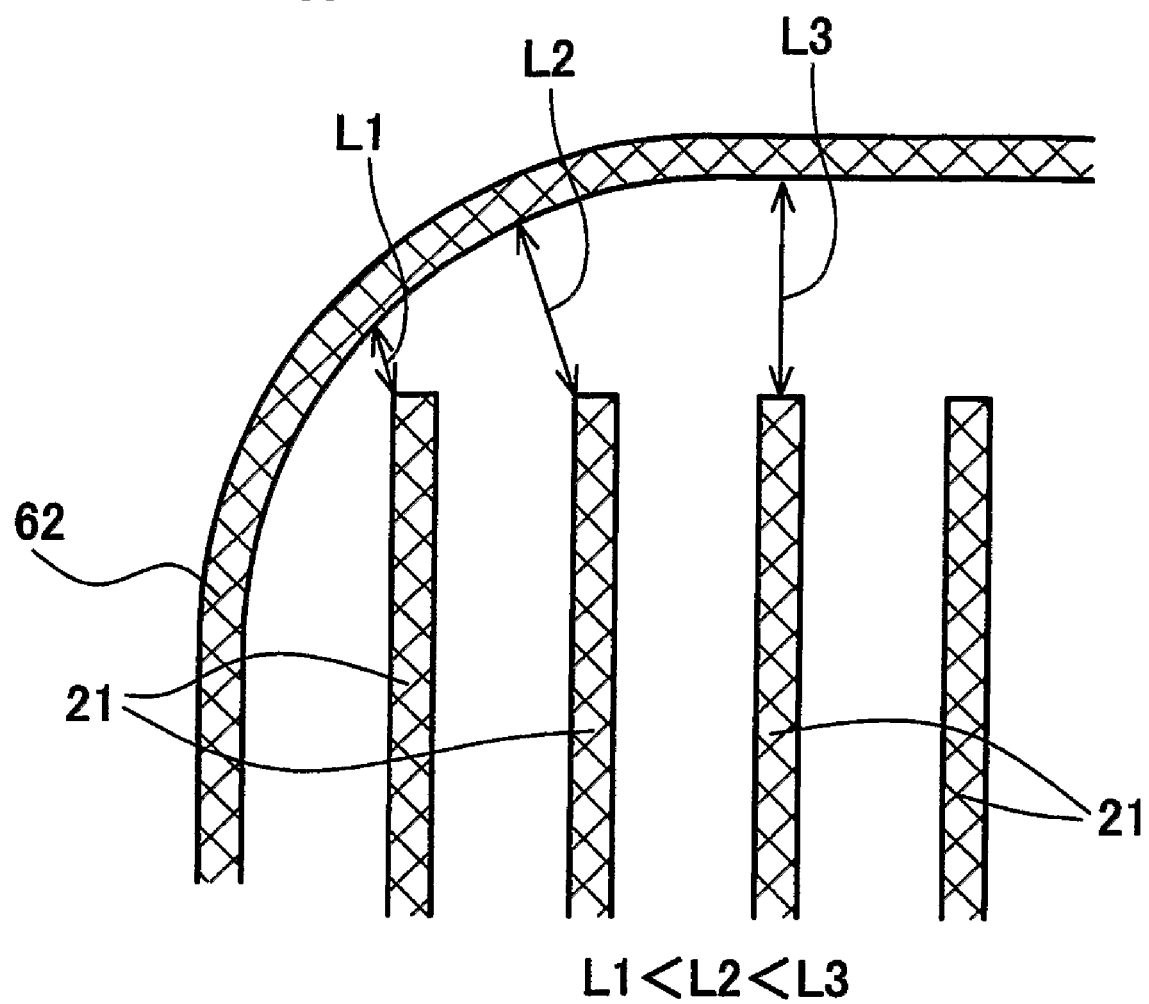
FIG. 14 is a plan view showing a corner and its vicinity of an terminal trench of the insulated gate semiconductor device shown in FIG. 12.
Figure 15:
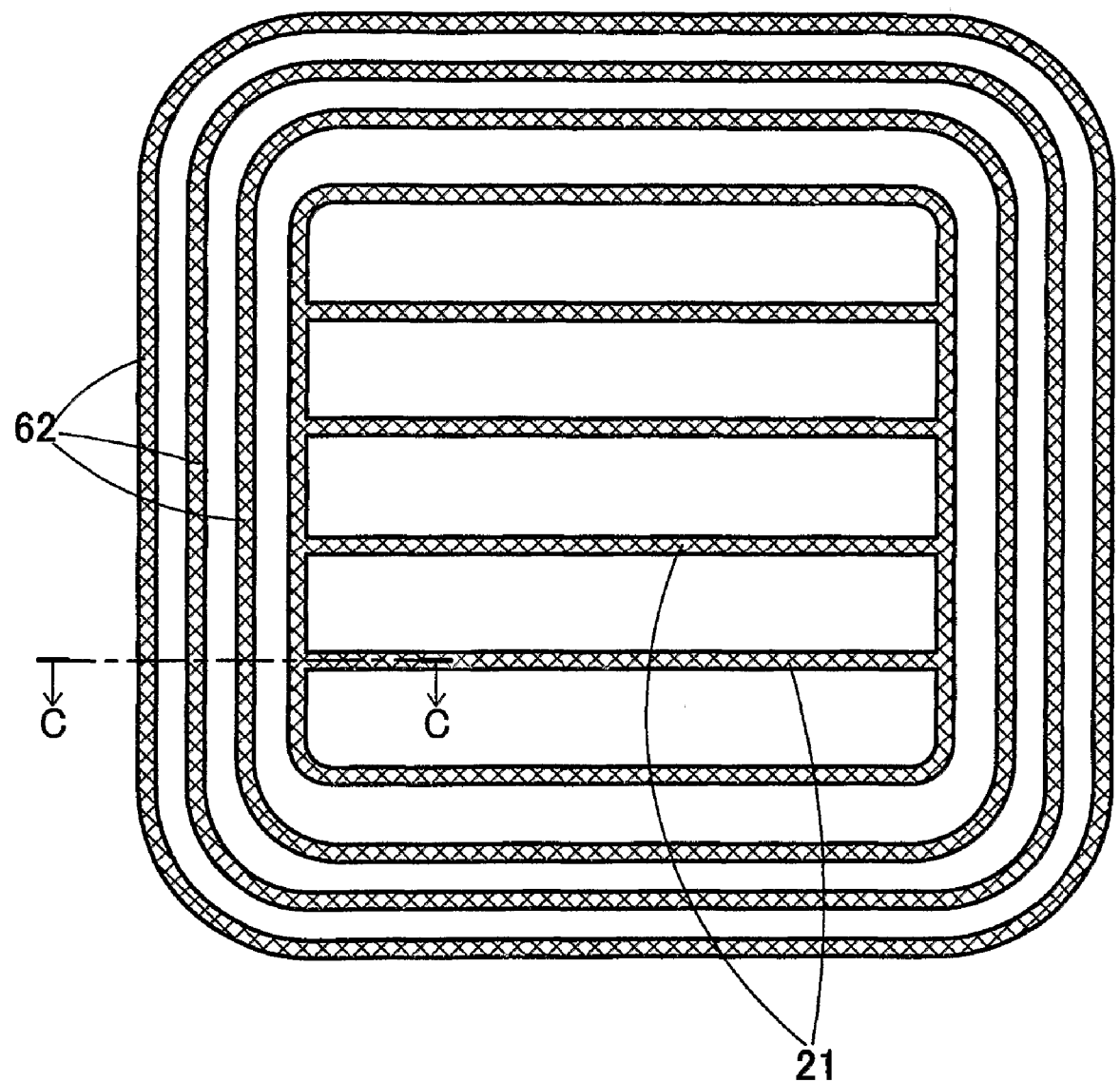
FIG. 15 is a plan view showing a structure of a conventional insulated gate semiconductor device (having junctions)
Figure 16:
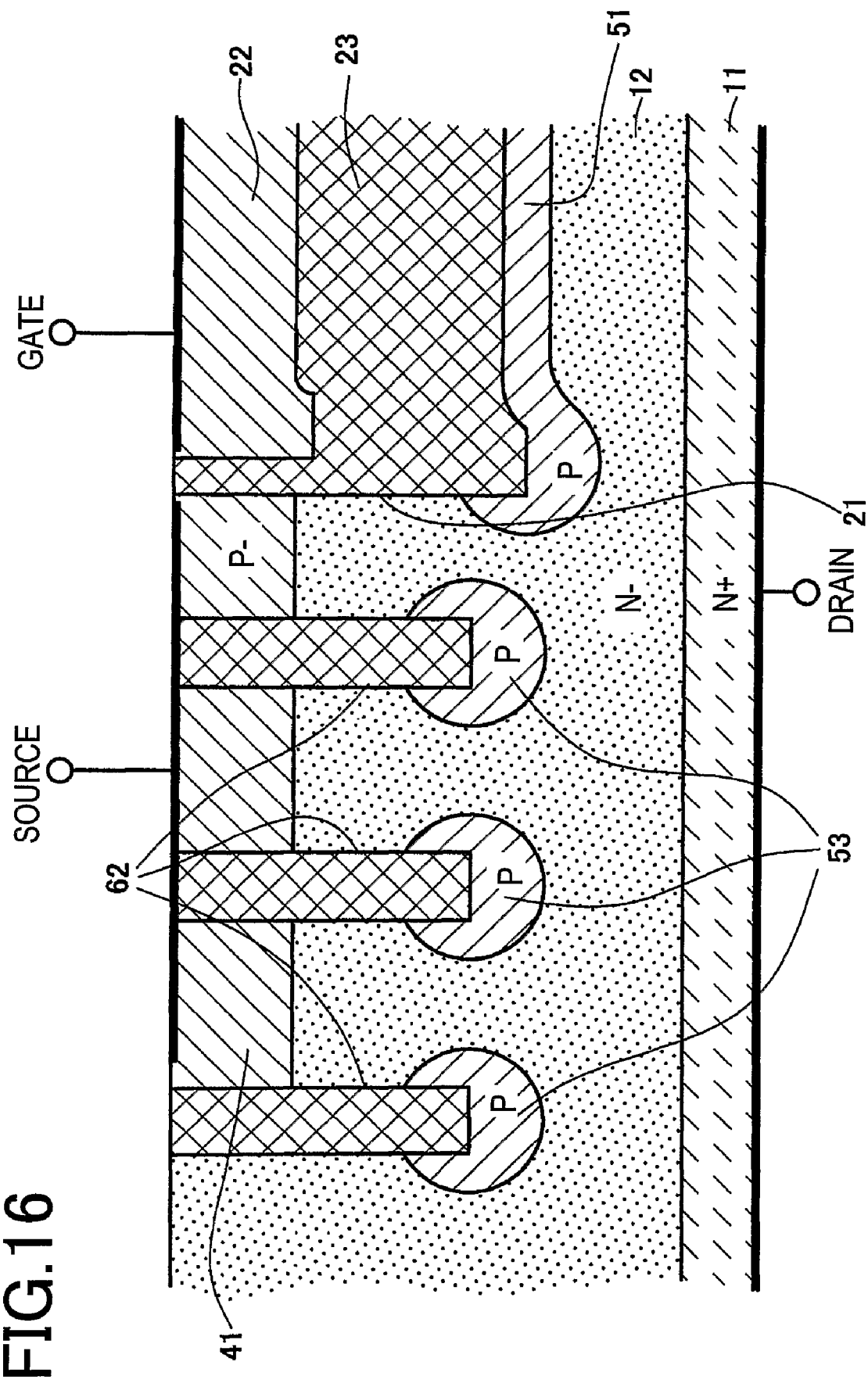
FIG. 16 is a sectional view taken along the line C-C of the insulated gate semiconductor device shown in FIG. 15.

In addition, as shown in FIG. 10, the two adjacent gate trenches 21 may be linked with each other at their ends. As a result, it is possible to make the spacings between the gate trenches 21 and the terminal trench 62 uniform. A decrease in the breakdown voltage is suppressed at portions where the two adjacent gate trenches 21 are linked with each other, while a decrease in the breakdown voltage may occur between the respective linked pairs of the gate trenches 21. Because of this, at the unlinked portions, a decrease in the breakdown voltage is suppressed by forming the breakdown voltage holding trenches 68 as described in the first embodiment. Alternatively, as shown in FIG. 9, curved-shape terminal trenches 62 are provided to suppress a decrease in the breakdown voltage.

INDUSTRIAL APPLICABILITY

According to the present invention, spacings between the ends of each trench of the first trench group and the side of the second trench are uniform. As a result, a decrease in the breakdown voltage is suppressed at gaps of the trenches. Additionally, since the trenches are not linked with each other, there is no junction between them, which do not bring about the decrease in the breakdown voltage. Therefore, an insulated gate semiconductor device has been realized which has floating regions around the bottoms of trenches and which is capable of reliably achieving a high breakdown voltage.

The invention claimed is:

1. An insulated gate semiconductor device comprising:
   a body region which is on the upper side of a semiconductor substrate and is a semiconductor of a first conductivity type;
   a drift region which is in contact with the bottom of the body region and is a semiconductor of a second conductivity type;
   a first trench group which are formed in a striped shape when viewed from above, pass through the body region, and contain a gate electrode;
   a second trench having portions formed in an arc shape when viewed from above;
   first floating regions which are surrounded by the drift region, surround the bottom of at least one trench of the first trench group, and are a semiconductor of the first conductivity type; and
   a second floating region which is surrounded by the drift region, surrounds the bottom of the second trench, is equal to the first floating regions in the thickness-wise position in the substrate and is a semiconductor of the first conductivity type,
   the second trench being a terminal trench surrounding the first trench group when viewed from above;
   electric field strength peak at two places in the semiconductor substrate in a thickness direction: at a first PN junction between the first floating regions and the drift region; and at a second PN junction between the body region and the drift region; and each end of each trench of the first trench group being perpendicular to a side portion of the second trench when viewed from above, shortest distances between the ends of each trench of the first trench group and the respective side of the second trench being equal in length.

2. The insulated gate semiconductor device according to claim 1, wherein another portion of the second trench is arced with respect to an end of at least one of the trenches of the first trench group.

3. The insulated gate semiconductor device according to claim 1, further comprising:

a third trench which is positioned in an area surrounded by lines linking the ends of the adjacent trenches of the first trench group and the second trench, and is not in contact with each trench of the first trench group and with the second trench; and a third floating region which is surrounded by the drift region, surrounds the bottom of the third trench, is equal to the first floating region in the thickness-wise position in the substrate and is a semiconductor of the first conductivity type, the third trench being positioned off lines linking the ends of each trench of the first trench group and the side of the second trench in the shortest distance when viewed from above.

4. The insulated gate semiconductor device according to claim 2, further comprising:

a third trench which is positioned in an area surrounded by lines linking the ends of the adjacent trenches of the first trench group and the second trench, and is not in contact with each trench of the first trench group and with the second trench; and a third floating region which is surrounded by the drift region, surrounds the bottom of the third trench, is equal to the first floating region in the thickness-wise position in the substrate and is a semiconductor of the first conductivity type, the third trench being positioned off lines linking the ends of each trench of the first trench group and the side of the second trench in the shortest distance when viewed from above.

5. An insulated gate semiconductor device according to claim 1, further comprising:

a fourth trench, which passes through the body region, is positioned between the adjacent trenches of the first trench group, is not in contact with each trench of the first trench group, and contains a gate electrode ; and a fourth floating region, which is surrounded by the drift region, surrounds the bottom of the fourth trench, is equal to the first floating region in the thickness-wise position in the substrate, and is a semiconductor of the first conductivity type, wherein ends of the fourth trench in a longitudinal direction when viewed from above are perpendicular to the sides of each trench of the first trench group.

6. An insulated gate semiconductor device according to claim 2, further comprising:

a fourth trench, which passes through the body region, is positioned between the adjacent trenches of the first trench group, is not in contact with each trench of the first trench group, and contains a gate electrode; and a fourth floating region, which is surrounded by the drift region, surrounds the bottom of the fourth trench, is equal to the first floating region in the thickness-wise position in the substrate, and is a semiconductor of the first conductivity type, wherein ends of the fourth trench in a longitudinal direction when viewed from above are perpendicular to the sides of each trench of the first trench group.

7. An insulated gate semiconductor device according to claim 3, further comprising:

a fourth trench, which passes through the body region, is positioned between the adjacent trenches of the first trench group, is not in contact with each trench of the first trench group, and contains a gate electrode; and a fourth floating region, which is surrounded by the drift region, surrounds the bottom of the fourth trench, is equal to the first floating region in the thickness-wise position in the substrate, and is a semiconductor of the first conductivity type, wherein ends of the fourth trench in a longitudinal direction when viewed from above are perpendicular to the sides of each trench of the first trench group.

* * * * *